(12) United States Patent
Wang et al.

(10) Patent No.: US 7,508,327 B2
(45) Date of Patent: Mar. 24, 2009

(54) INTEGER REPRESENTATION OF RELATIVE TIMING BETWEEN DESIRED OUTPUT SAMPLES AND CORRESPONDING INPUT SAMPLES

(75) Inventors: Song Wang, San Diego, CA (US); Eddie L. T. Choy, Carlsbad, CA (US); Samir Kumar Gupta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/558,313

(22) Filed: Nov. 9, 2006

(65) Prior Publication Data

US 2007/0290900 A1 Dec. 20, 2007

Related U.S. Application Data

(60) Provisional application No. 60/813,870, filed on Jun. 14, 2006.

(51) Int. Cl.
*H03M 7/00* (2006.01)
(52) U.S. Cl. .................................... 341/61; 314/122
(58) Field of Classification Search .................. 341/61, 341/110, 144, 122, 123
See application file for complete search history.

(56) References Cited

U.S. PATENT DOCUMENTS

| | | | |
|---|---|---|---|
| 5,982,305 A * | 11/1999 | Taylor | 341/61 |
| 6,473,457 B1 * | 10/2002 | Pascual et al. | 375/328 |
| 6,563,448 B1 | 5/2003 | Fontaine | |
| 6,747,858 B1 * | 6/2004 | Sculley et al. | 361/61 |
| 7,061,409 B1 * | 6/2006 | Jantti et al. | 341/61 |
| 7,227,477 B2 * | 6/2007 | Ye | 341/61 |
| 7,342,518 B2 | 3/2008 | Midya et al. | |

FOREIGN PATENT DOCUMENTS

EP 1569336 8/2005

OTHER PUBLICATIONS

Proakis, J. & Manolakis, D., "Digital Signal Processing: Principles, Algorithms and Applications," 3rd Ed., pp. 790, 815-821. Prentice Hall, Upper Saddle River, NJ, 1996.
International Search Report - PCT/US07/070038, International Search Authority, European Patent Office, Nov. 27, 2007.

* cited by examiner

*Primary Examiner*—Brian Young
(74) *Attorney, Agent, or Firm*—Timothy F. Loomis; Espanaco Diaz Hidalgo; Thomas R. Rouse

(57) ABSTRACT

In general, this disclosure describes techniques for changing a sampling frequency of a digital signal. In particular, the techniques provide a more accurate way to determining a relative timing between a desired output sample and a corresponding input sample using a non-approximated integer representation of the relative timing. The relative timing between the desired output sample and corresponding input sample may be represented using a first component that identifies a latest input sample of the digital signal used to generate intermediate samples, a second component that identifies an intermediate sample, and a third component that identifies a timing difference between the desired output sample and the intermediate sample. Each of the components may be recursively updated using non-approximated integer values.

57 Claims, 5 Drawing Sheets

INTEGER REPRESENTATION OF RELATIVE TIMING BETWEEN DESIRED OUTPUT SAMPLES AND CORRESPONDING INPUT SAMPLES

This application claims the benefit of U.S. Provisional Application No. 60/813,870, filed Jun. 14, 2006.

TECHNICAL FIELD

This disclosure relates to sampling rate converters and, more particularly, to digital domain sampling rate converters.

BACKGROUND

A sampling rate converter is used to change a sampling frequency of a digital signal, and may also be referred to as a re-sampler. A sampling rate converter may take the form of a hardware device and/or software, and may be either an up-sampler or a down-sampler. An up-sampler increases the sampling rate of a digital signal. A down-sampler reduces the sampling rate of the digital signal. A sampling frequency conversion rate is defined to be the ratio of a desired output sampling frequency to a given input sampling frequency. An up-sampling conversion rate is always greater than 1.0, while a down-sampling conversion rate is always less than 1.0.

Aliasing is a phenomenon that usually occurs when converting an analog signal to a digital signal, or vice versa. Aliasing may also occur when converting the sampling frequency of a digital signal. When aliasing occurs, signal energy at one frequency is imaged to other frequencies. For example, suppose a signal has two sinusoidal components at 1 kHz and 7.5 kHz, respectively. If the signal is sampled at 16 kHz, the signal can be reconstructed perfectly. If the signal is down-sampled to 4 kHz from 16 kHz by decimation by 4, the energy at 1 kHz will not change, but the energy at 7.5 kHz will be imaged to 0.5 kHz. The energy at 0.5 kHz is considered aliasing. As another example, if an analog sinusoidal signal at 1 kHz is sampled at 4 kHz, the energy will appear to be at 1 kHz, which is desirable. However, if the signal is up-sampled to 16 kHz by inserting three zeros between adjacent samples, the energy will appear to be at 1 kHz, 3 kHz, 5 kHz and 7 kHz. The energy at 3 kHz, 5 kHz and 7 kHz is an image of the energy at 1 kHz and is considered aliasing. To reduce distortion due to aliasing, sampling rate converters typically include an anti-aliasing filter, which is generally a low pass filter.

Anti-aliasing filters are typically needed in both up-samplers and down-samplers. For example, a conventional up-sampler typically includes an interpolator, which inserts certain number of zeros between adjacent samples and an anti-aliasing filter. Typically, the anti-aliasing filter is a low pass filter with bandwidth $\pi/I$, where I is up-sampling factor. As another example, a conventional down-sampler typically includes an anti-aliasing filter and a decimator which periodically picks one sample out of every certain number of samples. Typically, the anti-aliasing filter is a low pass filter with bandwidth $\pi/D$, where D is the down-sampling rate.

SUMMARY

In general, this disclosure describes techniques for changing a sampling frequency of a digital signal. In particular, the techniques provide an accurate way to determine a relative timing between desired output samples and corresponding input samples. Throughout this disclosure the term "phase" is used to refer to this relative timing between desired output samples and corresponding input samples. This disclosure describes techniques for determining the phase in an up-sampler more accurately using integer numbers.

For example, a sampling rate converter represents the phase using three components and tracks each component using integers. The first component, referred to herein as an input sample index, tracks the latest input samples that are used to generate the intermediate samples. The second component, referred to herein as the integer phase, tracks intermediate samples used to generate the output sample. The third component, referred to herein as the fractional phase, tracks a timing difference between output sample and its neighboring intermediate samples. In this manner, an up-sampler can provide an integer representation of the relative timing between desired output samples and corresponding input samples. Determining the phase of the output signal using integer numbers allows the up-sampler to more accurately up-sample the input signal by reducing resampling errors caused by inaccurate phare representation.

In one embodiment, a method comprises representing a relative timing between a desired output sample and a corresponding input sample of a digital signal using a first component that identifies a latest input sample of the digital signal used to generate related intermediate samples, a second component that identifies an intermediate sample, and a third component that identifies a timing difference between the desired output sample and the intermediate sample, wherein each of the components is represented as an non-approximated integer.

In another embodiment, an apparatus comprises a phase tracking module that represents a relative timing between a desired output sample and a corresponding input sample of a digital signal using a first component that identifies a latest input sample of the digital signal used to generate related intermediate samples, a second component that identifies an intermediate sample, and a third component that identifies a timing difference between the desired output sample and the intermediate sample, wherein each of the components is represented as an non-approximated integer.

In a further embodiment, a computer-readable medium comprises instructions that upon execution cause a processor to represent a relative timing between a desired output sample and a corresponding input sample of a digital signal using a first component that identifies a latest input sample of the digital signal used to generate related intermediate samples, a second component that identifies an intermediate sample, and a third component that identifies a timing difference between the desired output sample and the intermediate sample, wherein each of the components is represented as a non-approximated integer.

The details of one or more embodiments are set forth in the accompanying drawings and the description below. Other features, objects, and advantages will be apparent from the description and drawings, and from the claims.

DETAILED DESCRIPTION

Figure 1:
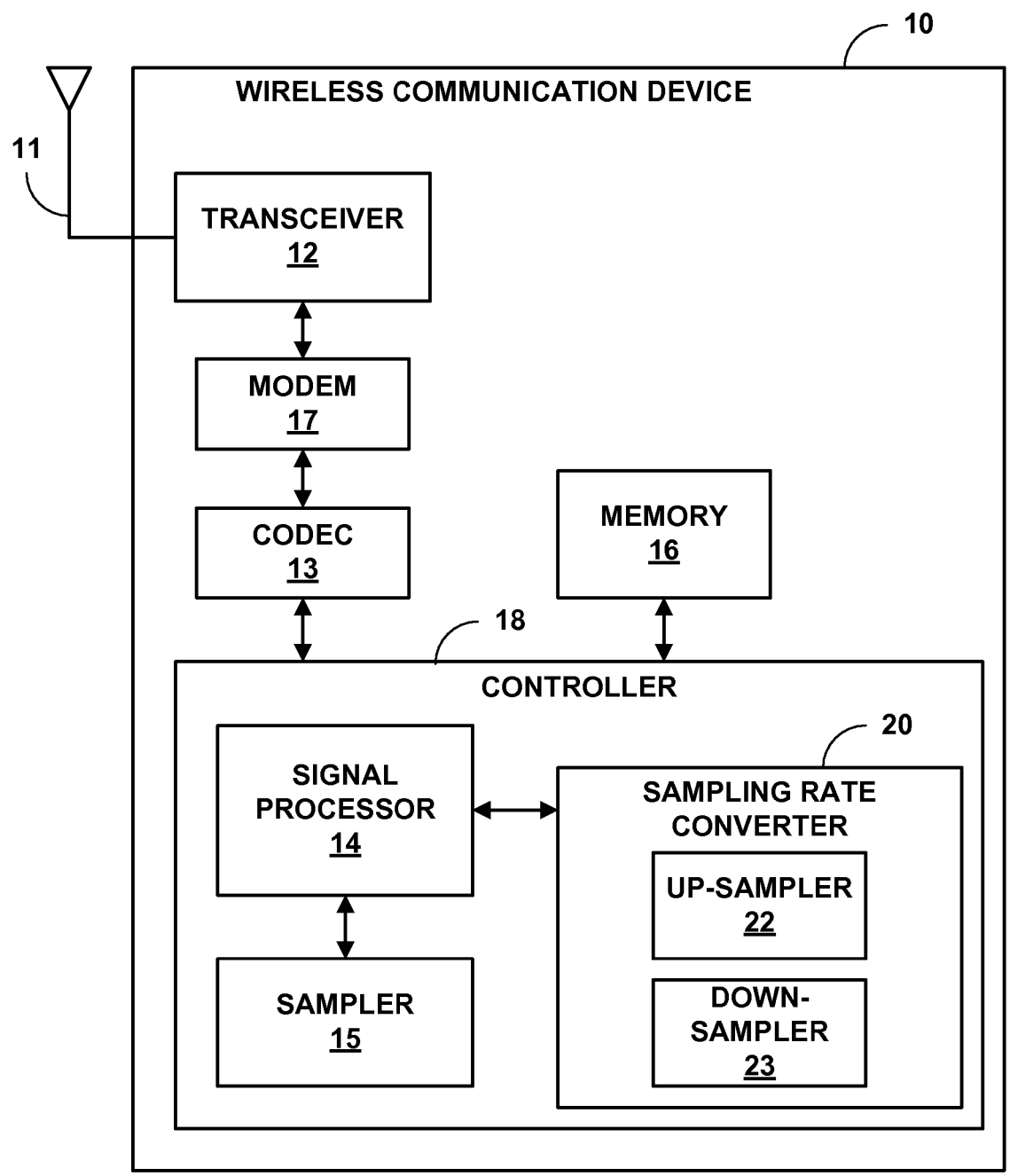
FIG. 1 is a block diagram illustrating a wireless communication device that up-samples an input digital signal using an integer representation of a relative timing between desired output samples and corresponding input samples.

This disclosure describes techniques for changing a sampling frequency of a digital signal. In particular, the techniques provide an accurate way to determine a relative timing between desired output samples and corresponding input samples. Throughout this disclosure the term "phase" is used to refer to this relative timing between desired output samples and corresponding input samples. In digital up-samplers, phase determination can be critical to the performance of the up-sampler. Inaccurate phase determination can result in additional reconstruct distortion and/or frequency skew in the up-sampled signal. This disclosure describes techniques for accurately determining the phase in an up-sampler using non-approximated integer numbers.

Conventionally, up-samplers track the phase of the output signal as a function of the conversion rate. The conversion rate is a fractional number that may be represented as the ratio between a desired output sampling frequency and an input sampling frequency ($f_o/f_i$). If a signal is being up-converted from 12 kHz to 48 kHz, for example, the conversion rate would be 4. Conventional up-samplers typically determine the phase, i.e., the relative timing between desired output samples and corresponding input samples, as a function of the conversion rate. If the up-sampler is operating at a conversion rate of 4, the up-sampler outputs four output samples for every one input sample. If the up-sampler starts generating output samples from the first input sample's time, it generates an output sample at the first input sample's time, ¼ of the way between the first and second input samples, ½ way between the first and second input sample, and ¾ of the way between the first and second input sample. The corresponding phase of each of the output samples is equal to n·τ(n), where n is a recursion index and τ(n) is inverse of conversion rate. In other words, the phase of each subsequent output sample is obtained by incrementing the phase of the previous output sample by the inverse of conversion rate. In this manner, the phase corresponds to the timing of the output samples relative to the input samples.

Because the conversion rate, and hence the phase, is a fractional number it may be either a finite or infinite value. The digital up-sampler represents the phase using a finite number of binary digits. The up-sampler can precisely represent finite fractional numbers, such as ½, ¾, and $^{127}/_{128}$, with the finite number of binary digits. However, to represent infinite fractional numbers, such as ⅓, 4/7, $^{441}/_{480}$, the up-sampler must quantize the fractional number to be able to represent it within the finite number of binary digits. Approximating infinite fractional numbers by quantization introduces some phase error in the up-sampling process. Specifically, each time the phase of the subsequent output sample is incremented by the approximated infinite fractional number, the location of the output sample relative to the input sample is slightly off due to the quantization. As the phase is continually incremented by the quantized inverse conversion rate value, the phase error increases and may in time accumulate to unacceptable levels.

In order to reduce the amount of phase error in the up-sampling process, the techniques of this disclosure provide a more accurate way to determine the phase of an up-sampled output signal. In particular, the techniques provide a way to represent the phase of the output signal using non-approximated integer numbers. As used herein, the phrase "non-approximated integer number" refers to an integer number that is not obtained by rounding, quantizing or otherwise approximating an infinite number. Tracking the phase of the output signal using non-approximated integer numbers allows the up-sampler to more accurately up-sample the input signal by reducing the phase errors caused by approximation of infinite fractional numbers.

FIG. 1 is a block diagram illustrating a wireless communication device (WCD) 10 that determines a relative timing between desired output samples and corresponding input samples of a digital signal using non-approximated integer numbers in accordance with the techniques described in this disclosure. WCD 10 may take the form of a mobile telephone, a satellite telephone, a wireless communication card incorporated within a portable computer, a personal digital assistant (PDA) equipped with wireless communication capabilities, or any of a variety of devices capable of wireless communication. The techniques of this disclosure are described in the context of wireless communication devices for exemplary purposes only. The techniques may also be useful in other devices, including wired communication devices, packet based communication devices, and devices such as audio playback devices, recording devices, and display devices that are not principally directed to communication.

WCD 10 may communicate with a plurality of base stations (not shown). The base stations are generally stationary equipments that wirelessly communicate with WCD 10 in order to provide network access to WCD 10. For example, the base stations may provide an interface between WCD 10 and a public switched telephone network (PSTN) such that telephone calls can be routed to and from WCD 10. Alternatively, or additionally, the base stations may be coupled to a packet-based network for transmission of packet-based voice information or packet-based data.

In the example of FIG. 1, WCD 10 includes an antenna 11, a transceiver 12, a codec (encoder/decoder) 13, a memory 16, and a controller 18. In some embodiments, controller 18 may comprise a mobile station modem (MSM) capable of controlling operation of WCD 10. WCD 10 may receive wireless signals from the base stations with transceiver 12 via antenna 11. Codec 13 then decodes the received wireless signals. Controller 18 receives digital signals at an input sampling rate from codec 13, processes the digital signals, and provides the processed signals to a user of WCD 10 and/or stores the processed signals in memory 16.

Controller 18 includes a signal processor 14, a sampler 15, and a sampling rate converter 20. Signal processor 14 processes a digital signal received from codec 13 at an input sampling frequency. Sampling rate converter 20 converts the input sampling frequency to a desired output sampling frequency depending on an application for the digital signal. Signal processor 14 may again process the digital signal at the desired output sampling frequency. In order to provide the signals to the user of WCD 10, sampler 15 comprises a digital-to-analog converter (DAC) and converts the digital signal at the desired output sampling frequency to an analog signal.

WCD 10 may also receive signals from the user of WCD 10. Controller 18 receives analog signals, converts the analog signals to digital signals, and processes the digital signals for transmission. In this case, sampler 15 comprises an analog-to-digital converter (ADC) and converts the analog signal to a digital signal at an input sampling frequency. Signal processor 14 processes the digital signal at the input sampling frequency. Sampling rate converter 20 converts the input sampling frequency to a desired output sampling frequency depending on an application for the digital signal. Signal processor 14 may again process the digital signal at the desired output sampling frequency. Codec 13 encodes the digital signal at the desired output sampling frequency. Transceiver 12 then transmits the encoded wireless signal to the base stations via antenna 11.

In some embodiments, controller 18 may include dedicated sets of signal processors, sampling rate converters, and samplers for signals received by transceiver 12 and signals to be transmitted by transceiver 12. In any case, controller 18 may be implemented as one or more processors, digital signal processors, application specific integrated circuits (ASICs), field programmable gate arrays (FPGAs), complex programmable logic devices (CPLDs), discrete logic, software, hardware, firmware or any combinations thereof.

Prior to processing a digital signal, controller 18 determines a desired output sampling frequency, $f_o$, of the digital signal based on a potential application for the digital signal. Potential applications for the received digital signals use a variety of sampling frequencies. For example, 8 kHz and 16 kHz sampling frequencies are used in voice communication applications. Audio compact disc (CD) applications use a 44.1 kHz sampling frequency. Digital audio tape (DAT) applications use a 48 kHz sampling frequency. Other typical sampling frequencies, including 11.025 kHz, 12 kHz, 12.8 kHz, 22.05 kHz, 24 kHz, 32 kHz, and 44 kHz, may be used in other digital signal applications. Converting digital signals to different output sampling frequencies may be particularly useful for concurrently executing more than one digital signal application within WCD 10. For example, controller 18 may wish to convert a voice communication application with a sampling frequency of 8 kHz and an audio application with a sampling frequency of 48 kHz to a common sampling frequency to permit simultaneous execution of the voice communication and audio application. Thus, a user of WCD 10 may listen to music while answering a phone call.

Sampling rate converter 20 within controller 18 may include an up-sampler 22 and a down-sampler 23 to convert the sampling rate of the digital signal from the input sampling frequency to the desired output sampling frequency. In particular, up-sampler 22 converts the input signals to a desired output frequency that is greater than the input frequency and down-sampler 23 converts the input signals to a desired output frequency that is less than the input frequency. In this manner, up-sampler 22 increases a sampling frequency of the input digital signal to produce an output digital signal with a bandwidth that is wider than the bandwidth of the original input digital signal. Up-sampler 22 may control distortion to the input digital signal spectrum and energy in the extended frequency band to a predetermined level to preserve fidelity of the signal. Up-sampler 22 supports arbitrary rational up-sampling rates to convert the input sampling frequency to the desired output sampling frequency by performing up-sampling and interpolation.

As an example, up-sampler 22 may convert the sampling frequency of an input digital signal, $f_i$, by first up-sampling the input digital signal by a factor of N to an intermediate signal at a sampling frequency of $Nf_i$. The intermediate sampling frequency $Nf_i$ is greater than or equal to the desired output frequency $f_o$. Up-sampler 22 may then convert the intermediate digital signal to the desired output sampling frequency $f_o$ based on an integer representation of the phase.

Up-sampler 22 determines a phase of the output signal (i.e., the rate-converted signal) using non-approximated integer numbers in accordance with the techniques described in this disclosure. Determining the phase of the output signal using non-approximated integer numbers allows the up-sampler to more accurately up-sample the input signal by reducing phase errors caused by approximation of infinite fractional numbers. As described in detail below, up-sampler 22 represents the phase using three components and tracks each component using non-approximated integer numbers. The first component, referred to herein as an input sample index, tracks the latest input sample that is used to generate a set of intermediate samples. The second component, referred to herein as the integer phase, tracks one of the intermediate samples. The third component, referred to herein as the fractional phase, tracks a timing difference between the output sample and the intermediate sample corresponding to the integer phase. In this manner, up-sampler 22 provides a non-approximated integer representation of the relative timing between desired output samples and corresponding input samples.

Figure 2:
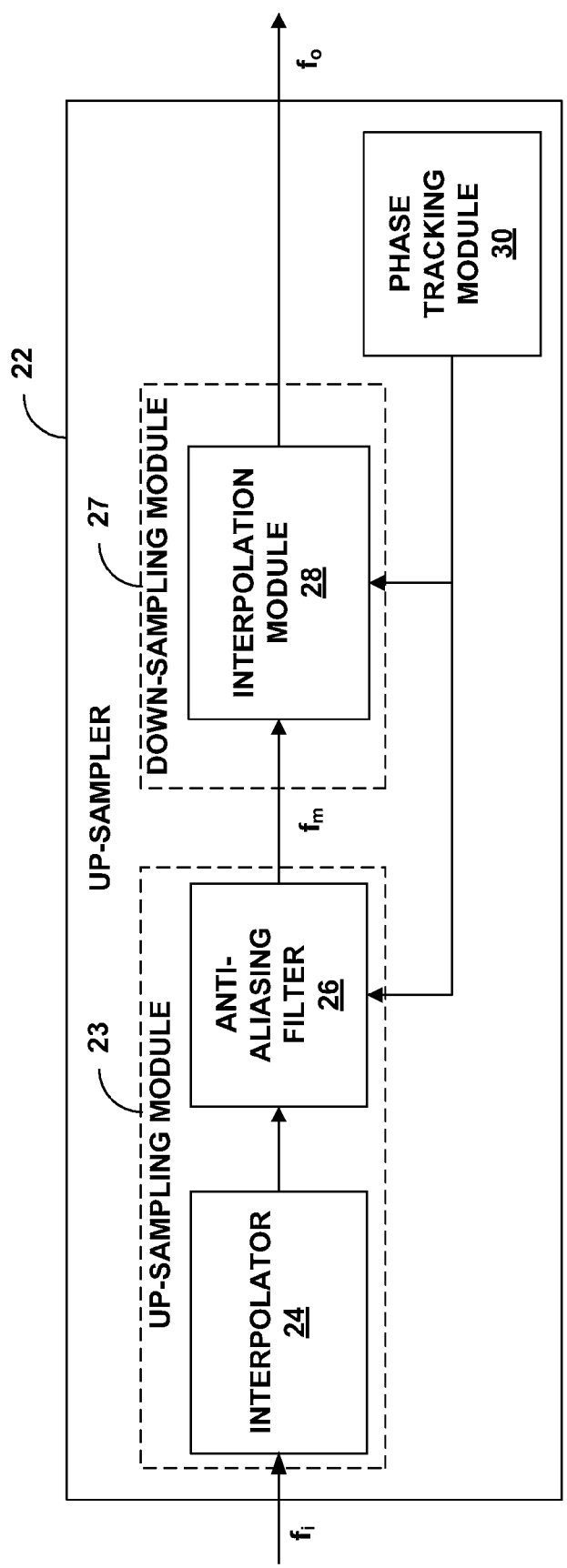
FIG. 2 is a block diagram illustrating an exemplary up-sampler that determines an integer representation of a phase of a rate-converted signal in accordance with the techniques described in this disclosure.

FIG. 2 is a block diagram illustrating an exemplary up-sampler, such as up-sampler 22 of FIG. 1, that generates a non-approximated integer representation of a phase of a rate-converted signal in accordance with the techniques described in this disclosure. Up-sampler 22 includes an up-sampling module 23, a down-sampling module 27 and a phase tracking module 30.

Up-sampling module 23 up-samples an input digital signal from an input sampling frequency, $f_i$, to an intermediate sampling frequency, $f_m$. In particular, up-sampling module 23 up-samples the digital signal by expanding the digital signal by an up-sampling factor N. Up-sampling module 23 may include an interpolator 24 to achieve this up-sampling process by inserting N−1 zeros between adjacent input samples of the digital signal. In this manner, interpolator 24 up-samples the digital signal to the intermediate sampling frequency $Nf_i$. Up-sampler 22 may filter the digital signal with an anti-aliasing filter 26 to remove any aliasing images or distortion present in the digital signal caused by inserting zeros. Anti-aliasing filter 26 may, for example, comprise a low pass filter with bandwidth π/N.

Down-sampling module 27 down-samples the up-sampled signal to a desired output sampling frequency, $f_o$, based on an integer representation of the phase. Down-sampling module 27 may include an interpolation module 28 that down-samples the intermediate signal to a desired output sampling frequency using any of a number of interpolation methods, such as zero-order interpolation, linear interpolation, higher order interpolations, and varieties of spline interpolations. As an example, interpolation module 28 may down-sample the up-sampled signal using linear interpolation according to the equation:

$$s_o(n) = [1-\lambda(n)]s_m^{prev}(n) + \lambda(n)s_m^{next}(n), \qquad (1)$$

where $s_o(n)$ is the $n^{th}$ output sample, $s_m^{prev}(n)$ is a corresponding previous intermediate sample, $s_m^{next}(n)$ is a corresponding next intermediate sample, and $\lambda(n)$ is an interpolation coefficient, which is computed based on the integer representation of the phase as described in detail below.

A linear interpolation coefficient may be computed using the equation:

$$\lambda(n) = \frac{t(n) - t^{prev}(n)}{t^{next}(n) - t^{prev}(n)}, \quad (2)$$

where $t(n)$ is a sample time of the $n^{th}$ output sample, $t^{prev}(n)$ and $t^{next}(n)$ are the sample times of the previous intermediate sample and the next intermediate sample, respectively. To minimize interpolation error, $\lambda(n)$ should be computed as accurately as possible.

In accordance with equation (1) above, interpolation module 28 outputs the previous intermediate sample when the timing of the output sample corresponds to the timing of the previous intermediate sample, i.e., when $\lambda(n)$ is equal to zero. In other words, up-sampler 22 does not have to perform linear interpolation. If $\lambda(n)$ is not equal to zero, interpolation module 28 performs interpolation to generate an output sample based on the previous intermediate sample and the next intermediate sample. Although this disclosure focuses on down-sampling from the intermediate sample frequency to the desired output sampling frequency using linear interpolation, the techniques described herein may be applied to any order of interpolation, such as zero-order interpolation, linear interpolation, higher order interpolations, and varieties of spline interpolations.

The sample time of $n^{th}$ output sample $t(n)$ is represented using that of input samples and intermediate samples. The absolute sample time of $n^{th}$ output sample can be expressed as $t(n)=n\nabla_o$, where $\nabla_o=1/f_o$. The relative output sample time with respect to input samples, referred to herein as phase $\tau(n)$, can be obtained by dividing $t(n)$ by $\nabla_i$, where $\nabla_i=1/f_i$, i.e., $\tau(n)=t(n)/\nabla_i=n(f_i/f_o)$. When $f_i/f_o$ is an infinite fractional number, up-sampler 22 quantizes the fractional number to be able to represent it within the finite number of binary digits. The phase $n(f_i/f_o)$ tends to have larger error since the quantization error is multiplied by n. As n gets larger, the phase error increases and may in time accumulate to unacceptable levels.

In accordance with the techniques of this disclosure, up-sampler 22 reduces the phase error by more accurately determining the phase $\tau(n)$ using an integer representation of the phase. More specifically, phase tracking module 30 represents the phase $\tau(n)$ using three components and tracks each of the components using integer numbers. Phase tracking module 30 may, for example represent the phase of an output sample $\tau(n)$ as:

$$\tau(n) = \alpha(n) + \frac{1}{N}\left[\beta(n) + \frac{\theta(n)}{f_o}\right], \quad (3)$$

$$\alpha(n), \beta(n), \theta(n) \in Z$$

$$0 \le \beta(n) < N$$

$$0 \le \theta(n) < f_o.$$

Here, $\alpha(n)$ represents the first component and is referred to as the input sample index, $\beta(n)$ represents the second component and is referred to as the integer phase and $\theta(n)$ represents the third component and is referred to as the fractional phase. The input sample index indicates the latest input sample that is used to generate a set of intermediate samples. The integer phase indicates one of the intermediate samples. The fractional phase represents a timing difference between a desired output signal and the intermediate sample indicated by the integer phase.

To generate a phase of a subsequent desired output sample, i.e., current output sample, phase tracking module 30 updates each of these phase components recursively, i.e., the phase components at time n are updated based on their values at time n−1. In other words, the phase components of the previous desired output sample are used to generate the phase components of the next desired output sample. During initialization, up-sampler 22 computes an integer phase increment ($d_{int}$) and a fractional phase increment ($d_{frac}$), which are used to recursively update the phase component values. Thus, the integer phase increment and the fractional phase increment represent the values of the incremental increases to the integer phase and the fractional phase, respectively. In one embodiment, phase tracking module 30 may compute $d_{int}$ and $d_{frac}$ in accordance with the following equations:

$$d_{int} = \left\lfloor \frac{Nf_i}{f_o} \right\rfloor, \quad (4)$$

$$d_{frac} = \text{mod}(Nf_i, f_o) = Nf_i - d_{int}f_o, \quad (5)$$

where N is an up-sampling factor, and $f_o$ and $f_i$ are input frequency and output frequency, respectively. In the equations above, the function $\lfloor x \rfloor$ denotes a floor function that equals the largest integer that is less than or equal to any variable x and mod(A, B) denotes the positive remainder in the division of A by B. In other words, $d_{int}$ is the quotient of $Nf_i$ divided by $f_o$, and $d_{frac}$ is the corresponding remainder.

Phase tracking module 30 updates the fractional phase of the previous output sample to obtain the fractional phase of the current output sample ($\theta(n)$) according to the equation:

$$\theta(n)=\text{mod}(\theta(n-1)+d_{frac}, f_o). \quad (6)$$

In accordance with equation (6), the fractional phase $\theta(n)$ is equal to $\theta(n-1)+d_{frac}$ when $\theta(n-1)+d_{frac}$ is less than $f_o$ and $\theta(n-1)+d_{frac}-f_o$ when $\theta(n-1)+d_{frac}$ is greater than or equal to $f_o$. Additionally, phase tracking module 30 sets a carryover $\xi_{frac}(n)$ associated with the fractional phase to one when $\theta(n-1)+d_{frac}$ is greater than or equal to $f_o$.

Phase tracking module 30 then computes the integer phase of the current output sample using the integer phase of the previous output sample, integer phase increment $d_{int}$ and the carryover $\xi_{frac}(n)$ associated with the fractional phase. As described above, the integer phase identifies one of the intermediate samples from which the timing of the output sample is referenced. The intermediate sample may be any of the plurality intermediate samples. As an example, the integer phase may identify an intermediate sample immediately previous to the desired output sample. Phase tracking module may, for example, compute the integer phase of the current output sample using the equation $$\beta^m(n)=\text{mod}(\beta^m(n-1)+d_{int}+\xi_{frac}(n), N), \quad (7)$$

In accordance with equation (7), integer phase of the current output sample is equal to $\beta^m(n-1)+d_{int}+\xi_{frac}(n)$ when $\beta^m(n-1)+d_{int}+\xi_{frac}(n)$ is less than the up-sampling rate N and $\beta^m(n-1)+d_{int}+\xi_{frac}(n)-N$ when $\beta^m(n-1)+d_{int}+\xi_{frac}(n)$ is greater than or equal to the up-sampling rate N. Phase tracking module 30 sets a carryover $\xi_{int}^m(n)$ associated with the integer phase of the current output sample to one when $\beta^m(n-1)+d_{int}+\xi_{frac}(n)$ is greater than or equal to the up-sampling rate N. In the equations above, the superscript m represents an index of one of the intermediate samples.

Phase tracking module 30 tracks an input sample index ($\alpha^m$(n)) associated with the intermediate sample identified by the integer phase. Phase tracking module 30 tracks the input sample index $\alpha^m$(n) using the carryover, $\xi_{int}^m$(n), associated with the integer phase of the current output sample. Specifically, phase tracking module 30 increments the input sample index $\alpha^m$(n) of the current output sample if the integer phase carryover is one. Otherwise, the input sample index $\alpha^m$(n) remains unchanged. In this manner, up-sampler 22 represents the relative timing between desired output samples and corresponding input samples by recursively tracking the three phase components using non-approximated integer numbers.

To assist interpolation module 28 in down-sampling via interpolation, phase tracking module 30 computes additional phase components associated with other intermediate samples. As an example, interpolation module 28 uses five phase components to generate an output sample using linear interpolation. The five phase components include an input sample index and integer phase associated with an intermediate sample immediately previous to a desired output sample ("previous intermediate sample"), an input sample index and integer phase associated with an intermediate sample immediately after the desired output sample ("next intermediate sample"), and a fractional phase used to implement interpolation. Out of the five phase components, only three are independent. In particular, the input sample index, the integer phase and the fractional phase that are used to represent the phase of the output sample are independent. The other input sample index and integer phase are computed as a function of the input sample index and integer phase used to represent the phase of the output sample. As an example, the input sample index and integer phase associated with the previous intermediate sample and the fractional phase may be used to represent the phase of the output samples. In that case, the input sample index and the integer phase associated with the next intermediate sample are dependent on the input sample index and integer phase associated with the previous intermediate sample. Alternatively, the input sample index and integer phase associated with the next intermediate sample and the fractional phase may be used to represent the phase of the output samples. In that case, the input sample index and the integer phase associated with the previous intermediate sample are dependent on the input sample index and integer phase associated with the next intermediate sample.

If the input sample index and integer phase associated with the previous intermediate sample are used to represent the phase of the output samples, the sample index associated with the previous intermediate sample ($\alpha^{prev}$(n)), the integer phase associated with the previous intermediate sample ($\beta^{prev}$(n)) and the fraction phase (($\theta$(n)) may be tracked as described above. In particular, phase tracking module computes and updates each of the components according to the equations:

$$\theta(n) = \mathrm{mod}(\theta(n-1) + d_{frac}, f_o)$$

$$\beta^{prev}(n) = \mathrm{mod}(\beta^{prev}(n-1) + d_{int} + \xi_{frac}(n), N)$$

$$\alpha^{prev}(n) = \alpha^{prev}(n-1) + \xi_{int}^{prev}(n).$$

To aid in interpolation, phase tracking module 30 then computes an integer phase and input sample index associated with one or more other intermediate samples. For linear interpolation, for example, phase tracking module 30 computes an integer phase and input sample index associated with a next intermediate sample. In one embodiment, phase tracking module 30 may compute the integer phase and input sample index associated with the next intermediate sample in the same manner as described above with respect to the previous intermediate sample. For example, phase tracking module 30 may update the integer phase and input sample index associated with the next intermediate sample according to the equations:

$$\beta^{next}(n) = \mathrm{mod}(\beta^{next}(n-1) + d_{int} + \xi_{frac}(n), N)$$

$$\alpha^{next}(n) = \alpha^{next}(n-1) + \xi_{int}^{next}(n).$$

Alternatively, phase tracking module 30 may compute the integer phase and input sample index associated with the next intermediate sample based on the integer phase and the input sample index associated with the previous intermediate sample. For example, phase tracking module may update the integer phase $\beta^{next}$(n) and input sample index $\alpha^{next}$(n) associated with a next intermediate sample using the equations:

$$\beta^{next}(n) = \mathrm{mod}(\beta^{prev}(n) + 1, N)$$

$$\alpha^{next}(n) = \alpha^{prev}(n) + \xi_{int}^{next}(n), \quad (8)$$

where, $\xi^{next}$(n) is a carryover associated with the computation of integer phase associated with the next intermediate sample (i.e., $\beta^{next}$(n)). If $\beta^{prev}$(n)+1 is greater than or equal to N, $\beta^{next}$(n) is set to be 1. Otherwise, it is set to be 0.

Interpolation module 28 uses the each of these components during interpolation to generate the output sample in accordance with equation (1) above. In particular, interpolation module 28 selects a previous intermediate sample and a next intermediate sample, and generates an output signal using the previous and next intermediate samples and the interpolation coefficient that is computed as a function of $\theta$(n). In particular, interpolation module 28 selects the previous intermediate sample using the corresponding input sample index and integer phase, i.e., $\alpha^{prev}$(n) and $\beta^{prev}$(n). Interpolation module 28 selects the next intermediate sample using the corresponding input sample index and integer phase, i.e., $\alpha^{next}$(n) and $\beta^{next}$(n). Interpolation module 28 computes the interpolation coefficient $\lambda$(n) using fractional phase $\theta$(n). Interpolation module 28 may compute the interpolation coefficient using the equation:

$$\lambda(n) = \theta(n)/f_o. \quad (9)$$

Interpolation module 28 uses the computed interpolation coefficient to generate the output sample in accordance with equation (1) above. If $\lambda$(n) is less than 0.5, the output sample generated by interpolation module 28 is closer to the previous intermediate sample. If $\lambda$(n) is greater than 0.5, the output sample generated by interpolation module 28 is closer to the next intermediate sample.

Since division is more computationally expensive than multiplication, interpolation module 28 may pre-calculate $1/f_o$, referred to as interpolation coefficient evaluation constant, to save computational cost. For example, interpolation module 28 may compute the interpolation coefficient evaluation constant at initialization and store the value within memory 16. Up-sampler 22 may provide for a special Q-factor arrangement to maintain satisfactory precision of the interpolation coefficient evaluation constant when the constants are represented using fixed point numbers. More specifically, to maximize the precision of this constant, the Q-factor can be determined as a function of $f_o$. Up-sampler may set the Q-factor to be equal to d+k, where k is the largest positive number such that $2^k < f_o$ and d is the number of bits used to represent $1/f_o$ as a fixed point number. If the fractional phase evaluation constant is represented as a 16-bit word, for example, the Q-factor is set to be 15+k to fully utilize all bits in a 16-bit word. Interpolation module 28 adjusts the Q-factor after the multiplication of θ(n) and $1/f_o$.

In another embodiment, the intermediate samples are only computed when they are needed. In this case, the input sample index and the integer phase may be used to control the anti-aliasing filter module 26. If the filter is implemented using polyphase filtering, the integer phase may also be used to select the corresponding polyphase filter.

Instead of using input sampling rate and output sampling rate, the same techniques may be used to track the phase using the conversion ratio. For example, phase tracking module may operate under a conversion ratio of U/D, where U and D are positive integer numbers and U is strictly less than D. Replacing $f_i$ and $f_o$ with U and D in the above equations, one can get the similar phase tracking result using the conversion ratio.

Although described in terms of interpolating the output sample via linear interpolation, the techniques of this disclosure may be used to generate output samples using other types of interpolation, such as zero-order interpolation, higher order interpolations, and varieties of spline interpolations. Depending on the type of interpolation to be performed, phase tracking module 30 may track or compute more phase components. If a second order interpolation is used, for example, phase tracking module 30 may track or compute three input sample indices and three integer phases to identify three intermediate samples for use in interpolation.

Several examples of converting a digital signal from an input sampling frequency to a desired output sampling frequency are illustrated for exemplary purposes below. As a first example, up-sampler 22 may receive a digital signal at an input sampling rate of 44.1 kHz and determine that a desired output sampling frequency of the digital signal is 48 kHz. In this example, up-sampler 22 selects an up-sampling factor of 10 and up-samples the input sample to 441 kHz. The integer phase and fractional phase increments are computed as illustrated below $$d_{int} = \lfloor Nf_i/f_o \rfloor = \lfloor 10 \times 44100/48000 \rfloor = 9$$

$$d_{frac} = Nf_i - d_{int}f_o = 10 \times 44100 - 9 \times 48000 = 9000$$

The phase evaluation constant is $1/48,000$. k is set to be 15. If the constant is stored in a signed 16 bit fixed-point number, the Q-factor should be set to be 30 to maximize its precision.

As a second example, up-sampler 22 receives a digital signal at an input sampling rate of 44.1 kHz and determines that a desired output sampling frequency of the digital signal is 48 kHz. In this example, up-sampler 22 selects a conversion ratio of 147/160 instead of using the input and output sampling frequencies. Up-sampler 22 up-samples the input sample by a factor of 10 to 441 kHz. The integer phase and fractional phase increment are $$d_{int} = \lfloor Nf_i/f_o \rfloor = \lfloor 10 \times 147/160 \rfloor = 9$$

$$d_{frac} = Nf_i - d_{int}f_o = 10 \times 147 - 9 \times 160 = 30$$

The phase evaluation constant is $1/160$. Here, k is 7. If the constant is stored in signed 16 bit fixed-point format, the Q-factor should be set to be 22. Compared with example I, the integer update processing stays the same. The fractional phase increment and phase evaluation constant are different. Here, the latter case is slightly more accurate due to the fact that the ratio of the quantization error of its phase evaluation constant to its phase evaluation constant is smaller.

As a third example, up-sampler 22 receive a digital signal at an input sampling rate of 22.05 kHz and determine that a desired output sampling frequency of the digital signal is 32 kHz. In this example, up-sampler 22 selects an up-sampling factor of 12 and up-samples the input sample to 264.6 kHz. The integer phase and fractional phase increments are computed as illustrated below $$d_{int} = \lfloor Nf_i/f_o \rfloor = \lfloor 12 \times 22050/32000 \rfloor = 8$$

$$d_{frac} = Nf_i - d_{int}f_o = 12 \times 22050 - 8 \times 32000 = 8600$$

The phase evaluation constant is $1/32,000$. k is set to be 14. If the constant is stored in signed 32 bit fixed-point format, the Q-factor should be set to be 45 to maximize its precision.

Figure 3:
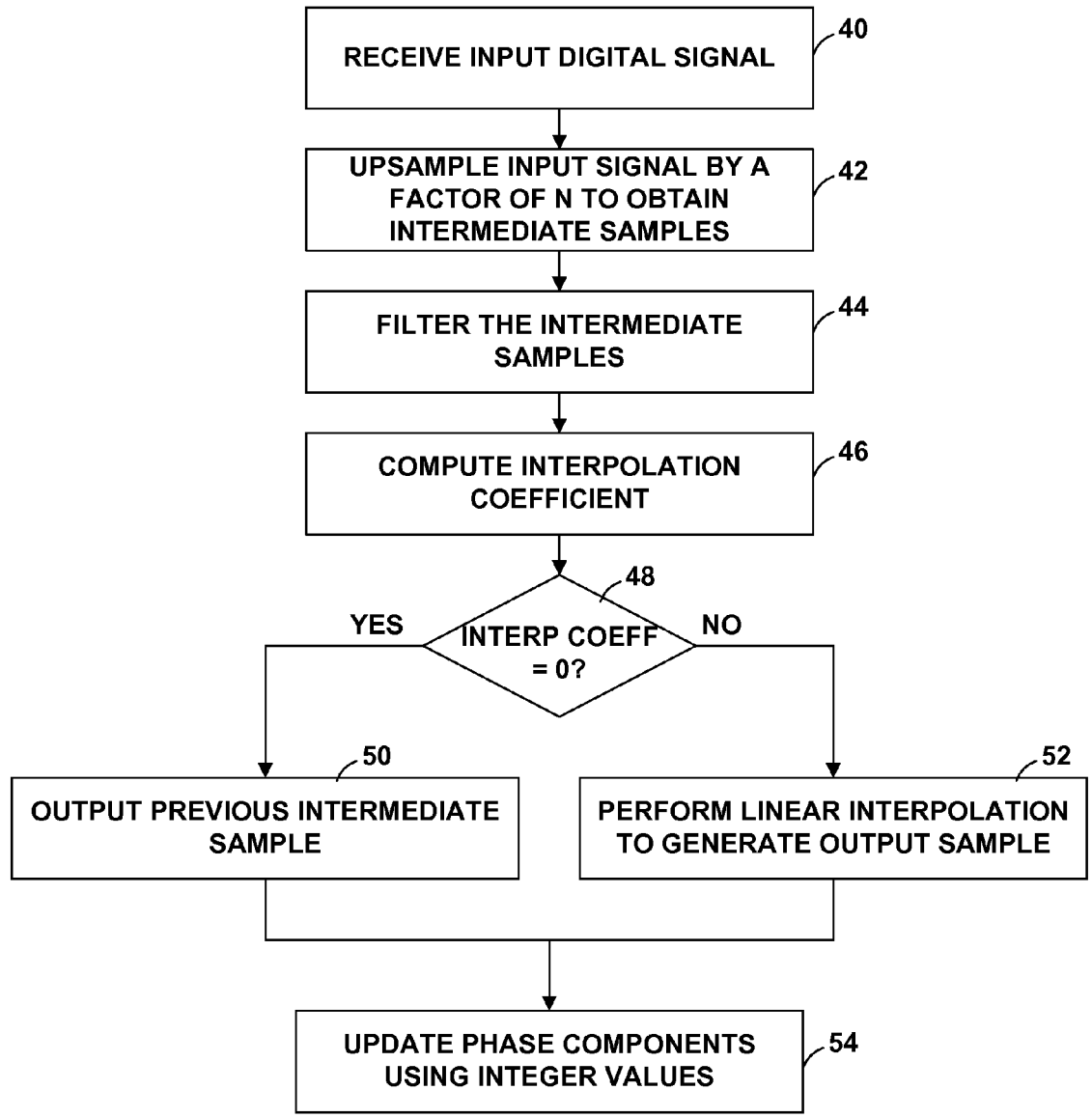
FIG. 3 is a flow diagram illustrating exemplary operation of an up-sampler up-sampling an input sampling frequency to a desired output sampling frequency.

FIG. 3 is a flow diagram illustrating exemplary operation of an up-sampler, such as up-sampler 22 of FIG. 2, up-sampling an input sampling frequency to a desired output sampling frequency. Up-sampler 22 receives the input digital signal at an input sampling frequency $f_i$ (40).

Up-sampler 22 up-samples the input digital signal from the input sampling frequency, $f_i$, to an intermediate sampling frequency, $f_m$ (42). Up-sampler 22 may up-sample the input digital signal by a factor of N by inserting N−1 zeros between adjacent input samples of the digital signal and filtering the resulted signal with an anti-aliasing filter. In this manner, up-sampler 22 up-samples the digital signal to an intermediate sampling frequency equal to $Nf_i$.

Up-sampler 22 filters the up-sampled digital signal (44). Up-sampler 22 may apply an anti-aliasing filter 26 to remove any aliasing images or distortion present in the digital signal. Anti-aliasing filter 26 may comprise a low pass filter with bandwidth π/N.

Interpolation module 28 computes a linear interpolation coefficient using the tracked fractional phase (46). Interpolation module 28 may compute the linear interpolation coefficient using the equation:

$$\lambda(n) = \theta(n)/f_o. \qquad (10)$$

Interpolation module 28 determines whether the interpolation coefficient is equal to zero (50). If the interpolation coefficient is equal to zero, the timing of the previous intermediate sample corresponds to the timing of a desired output sample and interpolation module 28 does not need to perform linear interpolation. Instead, interpolation module 28 outputs the previous intermediate sample that corresponds to the integer phase associated with the previous intermediate sample $β^{prev}(n)$. Interpolation module 28 may select the previous intermediate sample using the input sample index and the integer phase associated with the previous intermediate sample, and output the generated intermediate sample.

If the interpolation coefficient does not equal to zero, interpolation module performs interpolation to generate the output sample (52). Interpolation module 28 may use linear interpolation to generate the output signal $s_o(n)$ according to the equation:

$$s_o(n) = [1 - \lambda(n)] s_m^{prev}(n) + \lambda(n) s_m^{next}(n), \qquad (11)$$

where λ(n) is the computed interpolation coefficient, $s_m^{prev}(n)$ is the previous intermediate sample generated using $α^{prev}(n)$ and $β^{prev}(n)$, and $s_m^{next}(n)$ is the next intermediate sample generated using $α^{next}(n)$ and $β^{next}(n)$.

Up-sampler 22 tracks the phase of the output sample using integer values (54). Specifically, up-sampler 22 represents the phase of the output sample using three components, i.e., the input sample index α(n), the integer phase β(n) and the fractional phase θ(n), and tracks each component using non-approximated integer numbers as described in detail in this disclosure. As an example, the input sample index and integer phase associated with the previous intermediate sample and the fractional phase may be used to represent the phase of the output samples. In that case, the input sample index and the integer phase associated with the next intermediate sample are dependent on the input sample index and integer phase associated with the previous intermediate sample. Alternatively, the input sample index and integer phase associated with the next intermediate sample and the fractional phase may be used to represent the phase of the output samples. In that case, the input sample index and the integer phase associated with the previous intermediate sample are dependent on the input sample index and integer phase associated with the next intermediate sample. Up-sampler 22 uses the phase components in performing the interpolation to generate the output sample.

Figure 4:
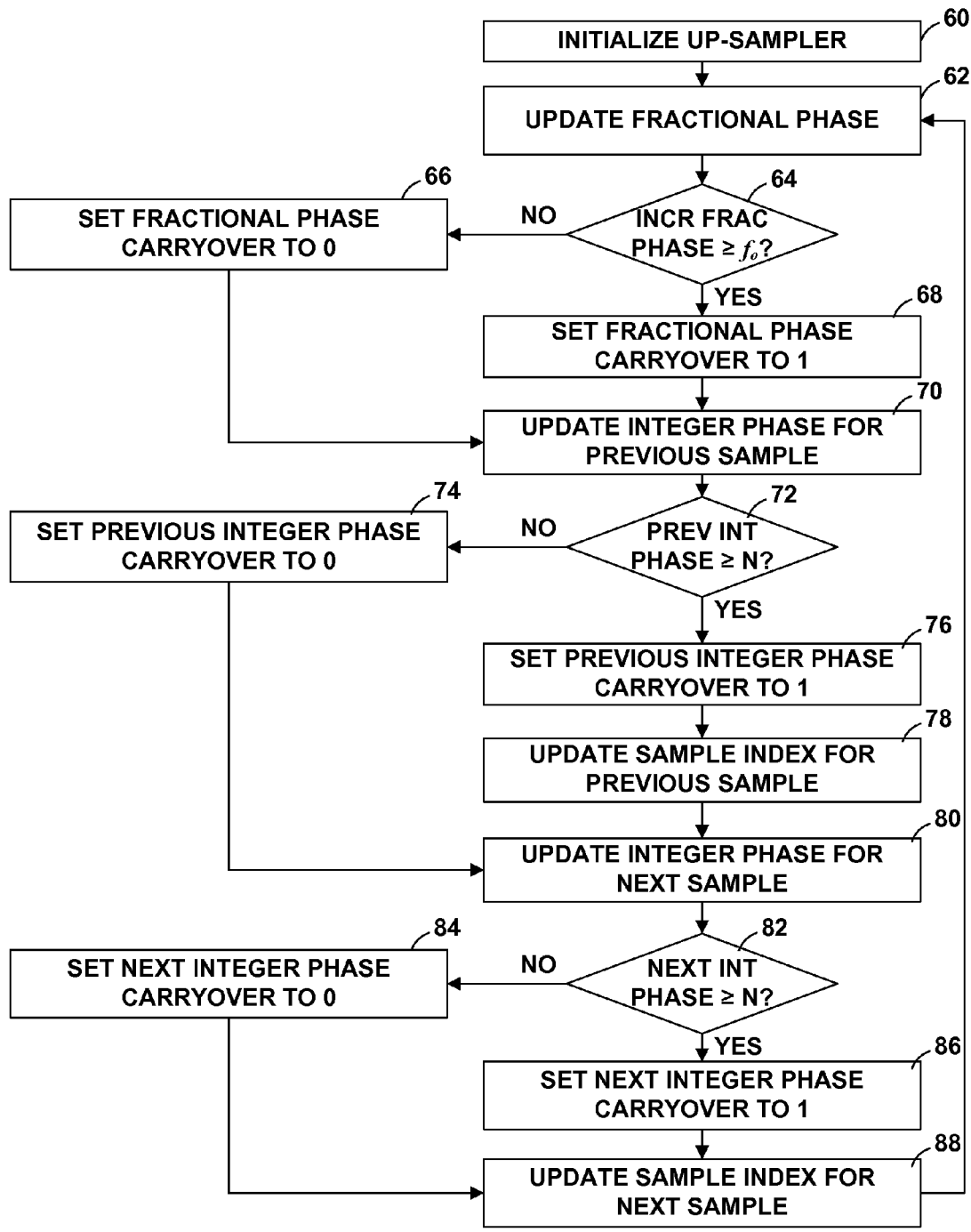
FIG. 4 is a flow diagram illustrating exemplary operation of an up-sampler determining a relative timing between desired output samples and corresponding input samples using integer numbers.

FIG. 4 is a flow diagram illustrating exemplary operation of an up-sampler, such as up-sampler 22, determining a relative timing between desired output samples and corresponding input samples using non-approximated integer numbers. As described above, determining the relative timing using non-approximated integer numbers allows up-sampler 22 to more accurately up-sample the input signal by reducing the phase errors cause by approximation of infinite fractional numbers. In the example described in FIG. 4, the input sample index and integer phase associated with the previous intermediate sample and the fractional phase may be used to represent the phase of the output samples. As described above, however, the input sample index and integer phase associated with any intermediate sample may be used to represent the phase of the output samples.

First, up-sampler 22 is initialized (60). During initialization, up-sampler 22 computes an integer phase increment ($d_{int}$) and a fractional phase increment ($d_{frac}$). In one embodiment, up-sampler 22 may compute $d_{int}$ and $d_{frac}$ in accordance with the following equation:

$$d_{int} = \left\lfloor \frac{Nf_i}{f_o} \right\rfloor, \quad (12)$$

$$d_{frac} = \mathrm{mod}(Nf_i, f_o) = Nf_i - d_{int}f_o, \quad (13)$$

where N is an up-sampling rate, $f_o$ and $f_i$ are input frequency and output frequency, respectively. In the equations above, $\lfloor x \rfloor$ is a floor function that is equal to the largest integer that is less than or equal to x and mod(A, B) denotes the positive remainder in the division of A by B. In other words, $d_{int}$ is the quotient when $Nf_i$ is divided by $f_o$, and $d_{frac}$ is the corresponding remainder. Since $f_i$ is less than $f_o$, the following relationships hold:

$0 \leq d_{int} < N$, $0 \leq d_{frac} < f_o$.

Up-sampler 22 may also initialize an integer phase related to an intermediate sample, such as a previous intermediate sample $\beta^{prev}(n)$, a fractional phase ($\theta(n)$). Since, $\beta^{next}(n)$ is computed using equation (8) based on $\beta^{prev}(n)$, there is no need to initialize it. When n, a recursion index, is equal to 0 the $\beta^{prev}(n)$ may be set to be any number between 0 and N−1. $\theta(n)$ may be set to be any number between 0 and $f_o$−1.

Up-sampler 22 updates the fractional phase (62). Up-sampler 22 may compute $\theta(n)$ using the following equation:

$$\theta(n) = \mathrm{mod}(\theta(n-1) + d_{frac}, f_o), \quad (14)$$

where modulo operator $\mathrm{mod}(x, M) = x - \lfloor x/M \rfloor M$. Thus, $\theta(n)$ may be rewritten as $$\theta(n) = (\theta(n-1) + d_{frac}) - \lfloor (\theta(n-1) + d_{frac})/f_o \rfloor f_o. \quad (15)$$

Up-sampler 22 determines whether the incremented fractional phase ($\theta(n-1) + d_{frac}$) is greater than or equal to $f_o$ (64). If $\theta(n-1) + d_{frac}$ is greater than or equal to $f_o$, the new fractional phase $\theta(n)$ computed by up-sampler 22 is $\theta(n-1) + d_{frac} - f_o$ in accordance with equation (14). Up-sampler 22 sets a fractional phase carryover ($\xi_{frac}(n)$) to 1 (68). In this manner, up-sampler 22 tracks the numerator of the fractional phase with integers while still accounting for the fractional phase carryover.

If $\theta(n-1) + d_{frac}$ is not greater than or equal to $f_o$, the new fractional phase $\theta(n)$ computed by up-sampler 22 is $\theta(n-1) + d_{frac}$ in accordance with equation (14). Up-sampler 22 sets a fractional phase carryover ($\xi_{frac}(n)$) to 0 since there is no carryover (66). Thus, fractional phase carryover $\xi_{frac}(n)$ is defined as:

$$\xi_{frac}(n) = \begin{cases} 0 & \theta(n-1) + d_{frac} < f_o \\ 1 & \text{else} \end{cases}. \quad (16)$$

Up-sampler 22 updates the integer phase associated with previous intermediate sample ($\beta^{prev}(n)$) using integer phase increment $d_{int}$ and carryover from the fractional phase update $\xi_{frac}(n)$ (70). Up-sampler 22 may, for example, compute $\beta^{prev}(n)$ in accordance with the equation:

$$\beta^{prev}(n) = \mathrm{mod}(\beta^{prev}(n-1) + d_{int} + \xi_{frac}(n), N). \quad (17)$$

Up-sampler 22 determines whether $\beta^{prev}(n-1) + d_{int} + \xi_{frac}(n)$ is greater than or equal to N (72). If $\beta^{prev}(n-1) + d_{int} + \xi_{frac}(n)$ is greater than N, the new integer phase associated with the previous intermediate sample $\beta^{prev}(n)$ is equal to $\beta^{prev}(n-1) + d_{int} + \xi_{frac}(n) - N$ in accordance with equation (17). Additionally, up-sampler 22 sets an integer phase carryover associated with the previous intermediate sample ($\xi_{int}^{prev}(n)$) to 1 (76). In this manner, up-sampler 22 tracks the integer phase associated with the previous intermediate sample with integers while still accounting for the carryover.

If $\beta^{prev}(n-1) + d_{int} + \xi_{frac}(n)$ is less than N, the new integer phase associated with the previous intermediate sample $\beta^{prev}(n)$ is equal to $\beta^{prev}(n-1) + d_{int} + \xi_{frac}(n)$. In this case, up-sampler 22 sets the carryover $\xi_{int}^{prev}(n)$ to 0 since there is no carryover (74). Thus, integer phase carryover $\xi_{int}^{prev}(n)$ may be defined as:

$$\xi_{int}^{prev}(n) = \begin{cases} 0 & \beta^{prev}(n-1) + d_{int}(n) + \xi_{frac}(n) < N \\ 1 & \text{else} \end{cases}. \quad (18)$$

Up-sampler 22 updates a sample index ($\alpha^{prev}(n)$) associated with the previous intermediate sample using carryover from integer phase update, $\xi_{int}^{prev}(n)$ (78). Specifically, up-sampler 22 increments the sample index if the carryover is 1 and does not increment the sample index if the carryover is zero. Up-sampler 22 may, for example, update the sample index $\alpha^{prev}(n)$ using the equation:

$$\alpha^{prev}(n) = \alpha^{prev}(n-1) + \xi_{int}^{prev}(n), \quad (19)$$

In this manner, up-sampler 22 tracks the phase of the output sample using the sample index of the previous intermediate sample, the integer phase associated with the previous intermediate sample, and the fractional phase.

To aid in interpolation, sampling rate converter 20 computes the integer phase for next intermediate sample, $\beta^{next}(n)$ (80). Up-sampler 22 may, for example, compute $\beta^{next}(n)$ using the equation:

$$\beta^{next}(n)=\mod(\beta^{prev}(n)+1, N). \quad (20)$$

Up-sampler 22 determines whether $\beta^{prev}(n)+1$ is greater than or equal to N (82). If $\beta^{prev}(n)+1$ is greater than N, the new integer phase associated with the next intermediate sample $\beta^{next}(n)$ is equal to $\beta^{prev}(n)+1-N$ in accordance with equation (20). Additionally, up-sampler 22 sets an integer phase carryover associated with the next intermediate sample ($\xi_{int}^{next}(n)$) to one (86). In this manner, up-sampler 22 tracks the integer phase associated with the next intermediate sample with integers while still accounting for the carryover.

If $\beta^{prev}(n)+1$ is less than N, the new integer phase associated with the previous intermediate sample $\beta^{prev}(n)$ is equal to $\beta^{prev}(n)+1$. In this case, up-sampler 22 sets the carryover $\xi_{int}^{next}(n)$ to 0 since there is no carryover (84). Thus, integer phase carryover $\xi_{int}^{next}(n)$ is defined as:

$$\xi_{int}^{next}(n) = \begin{cases} 0 & \beta^{next}(n)+1 < N \\ 1 & \text{else} \end{cases} \quad (21)$$

Up-sampler 22 updates a sample index associated with the next intermediate sample using carryover from integer phase update, $\xi_{int}^{next}(n)$ (88) and the sample index associated with the previous intermediate sample, $\alpha^{prev}(n)$. Specifically, up-sampler 22 increments the sample index if the carryover is 1 and does not increment the sample index if the carryover is zero. The integer phase update may be computed using the equation:

$$\alpha^{next}(n)=\alpha^{prev}(n)+\xi_{int}^{next}(n), \quad (22)$$

Although in the example illustrated in FIG. 4 up-sampler 22 represents the phase of the output samples using the input sample index and integer phase associated with the previous intermediate sample and the fractional phase, up-sampler 22 may represent the phase of the output samples using the integer phase and input sample index associated with the next intermediate sample. Up-sampler 22 then computes the integer phase and input sample index associated with the previous intermediate sample based on the result. Moreover, up-sampler 20 may update the integer phase and the input sample index associated with the next intermediate sample in the same way the integer phase and the input sample index associated with the previous intermediate sample are computed.

Figure 5:
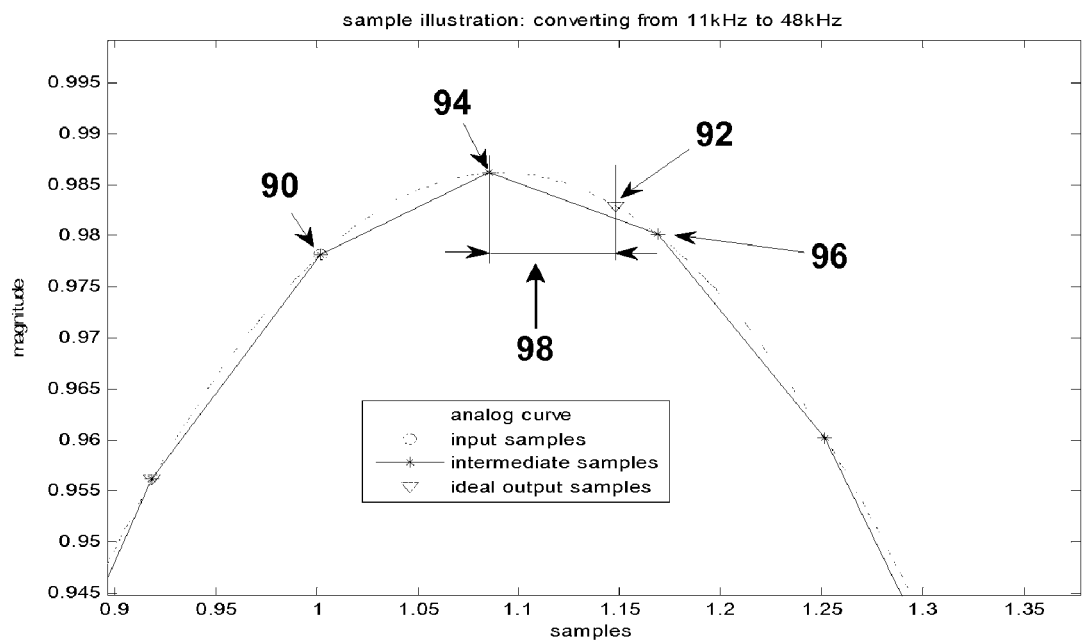
FIG. 5 is a graph illustrating an exemplary conversion of an input sample from 11 kHz to 48 kHz in accordance with the techniques of this disclosure.

FIG. 5 is a graph illustrating conversion of an input sample from 11 kHz to 48 kHz in accordance with the techniques of this disclosure. In the example illustrated in FIG. 5, an up-sampler, such as up-sampler 22 up-samples an input digital signal by a up-sample factor of 12, i.e., N=12, to obtain intermediate samples at a sampling rate of 132 kHz. Up-sampler 22 may, for example, generate 11 intermediate samples between each of the input samples.

The example illustrated in FIG. 5 shows one input sample 90 located at an input sample index of one. Additionally, the graph in FIG. 5 shows three of the eleven intermediate input samples that are inserted between the input sample 90 at input sample index one and an input sample at input sample index two (not shown). Up-sampler 22 desires to generate an output sample 92 at the location indicated by triangle. Because the location/timing of the desired output sample does not correspond to any intermediate sample, up-sampler 22 must perform linear interpolation to obtain the output sample based on the previous intermediate sample and the next intermediate sample.

Up-sampler 22 uses the input sample index and integer phases tracked in accordance with the techniques described herein to generate the previous intermediate sample 94 and the next intermediate sample 96. In this case, the input sample index for both of the intermediate samples is equal to one, i.e., input sample 90 together with its previous input samples is used to generate both the intermediate samples. The integer phase for the previous intermediate sample 94 is equal to one because the intermediate sample that is immediately previous to the desired output sample 92 is the first intermediate sample generated using the input sample 90 at input sample index one. Likewise, the integer phase for the next intermediate sample 96 is equal to two because the intermediate sample that is immediately after to the desired output sample 92 is the third intermediate sample generated using the input sample 90 at input sample index one.

As further illustrated in FIG. 5, the fractional phase component 98 is a measure of the timing difference between the previous intermediate sample 94 and the desired output 92. Up-sampler 22 uses the fractional phase component 98 to generate the interpolation coefficient, and interpolates the output sample using the previous and next intermediate samples generated based on the corresponding input sample index and integer phases, and the computed linear interpolation coefficient.

Figure 6:
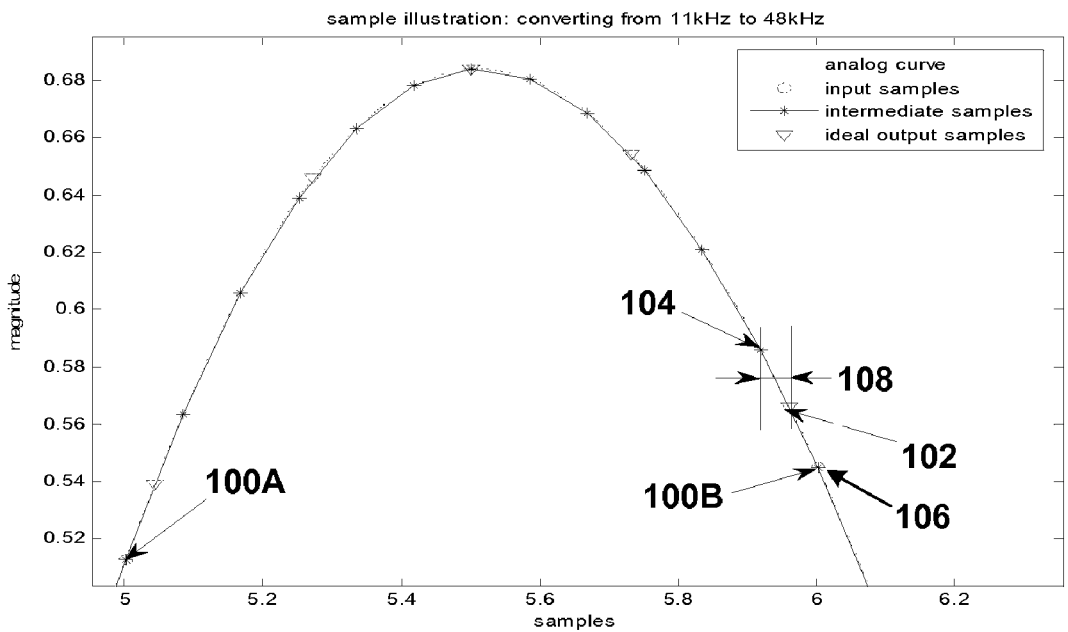
FIG. 6 is another graph illustrating exemplary conversion of an input sample from 11 kHz to 48 kHz.

FIG. 6 is a graph illustrating conversion of an input sample from 11 kHz to 48 kHz in accordance with the techniques of this disclosure. The graph illustrated in FIG. 6 illustrates the same conversion as the graph in FIG. 5, but at a different location in the signal, i.e., between input samples five and six.

The example illustrated in FIG. 6 shows two input samples 100A and 100B at input sample indexes five and six, respectively. Additionally, the graph in FIG. 6 shows all eleven intermediate input samples that are generated by the up-sampler between the input sample 100A at input sample index five and input sample 100B at input sample index six. Up-sampler 22 desires to generate a number of output samples identified as triangles. We will focus on the generation of the output sample 102. Because the location/timing of the desired output sample 102 does not correspond to any intermediate sample, up-sampler 22 must perform linear interpolation to obtain the output sample based on the previous intermediate sample and the next intermediate sample.

Up-sampler 22 uses the input sample index and integer phases tracked in accordance with the techniques described herein to generate the previous intermediate sample 104 and the next intermediate sample 106. In this case, the input sample index for the previous intermediate sample 104 is different than the input sample index for the next intermediate sample 106. In particular, the input sample index for the previous intermediate sample 104 is equal to five, while the input sample index associated with the next intermediate sample 106 is equal to six. In other words, the next intermediate sample is generated using input sample 100B and its previous input samples, as opposed to input sample 100A and its previous input samples.

The integer phase for the previous intermediate sample 104 is equal to eleven because the intermediate sample that is immediately previous to the desired output sample 102 is the eleventh intermediate sample generated using the input sample 100A at input sample index five. The integer phase for the next intermediate sample is equal to zero because the intermediate sample that is immediately after to the desired output sample 102 is equal to the input sample located at input sample 100B at index six.

As further illustrated in FIG. 6, the fractional phase component 108 measures the timing difference between the previous intermediate sample 104 and the desired output 102. Up-sampler 22 uses the fractional phase component 108 to generate the interpolation coefficient, and interpolates the output sample using the previous and next intermediate samples generated based on the corresponding input sample index and integer phases, and the computed linear interpolation coefficient.

A number of embodiments have been described. However, various modifications to these embodiments are possible, and the principles presented herein may be applied to other embodiments as well. Methods as described herein may be implemented in hardware, software, and/or firmware. The various tasks of such methods may be implemented as sets of instructions executable by one or more arrays of logic elements, such as microprocessors, embedded controllers, or IP cores. In one example, one or more such tasks are arranged for execution within a mobile station modem chip or chipset that is configured to control operations of various devices of a personal communications device such as a cellular telephone.

The techniques described in this disclosure may be implemented within a general purpose microprocessor, digital signal processor (DSP), application specific integrated circuit (ASIC), field programmable gate array (FPGA), complex programmable logic device (CPLD) or other equivalent logic devices. If implemented in software, the techniques may be embodied as instructions on a computer-readable medium such as random access memory (RAM), read-only memory (ROM), non-volatile random access memory (NVRAM), electrically erasable programmable read-only memory (EEPROM), FLASH memory, or the like. The instructions cause one or more processors to perform certain aspects of the functionality described in this disclosure.

As further examples, an embodiment may be implemented in part or in whole as a hard-wired circuit, as a circuit configuration fabricated into an application-specific integrated circuit, or as a firmware program loaded into non-volatile storage or a software program loaded from or into a data storage medium as machine-readable code, such code being instructions executable by an array of logic elements such as a microprocessor or other digital signal processing unit. The data storage medium may be an array of storage elements such as semiconductor memory (which may include without limitation dynamic or static RAM, ROM, and/or flash RAM) or ferroelectric, ovonic, polymeric, or phase-change memory; or a disk medium such as a magnetic or optical disk.

The invention claimed is:

1. A method comprising representing a relative timing between a desired output sample and a corresponding input sample of a digital signal using a first component that identifies a latest input sample of the digital signal used to generate related intermediate samples, a second component that identifies an intermediate sample, and a third component that identifies a timing difference between the desired output sample and the intermediate sample, wherein each of the components is represented as a non-approximated integer.

2. The method of claim 1, further comprising updating the third component according to the equation:

$$\theta(n) = (\theta(n-1) + d_{frac}) - \lfloor (\theta(n-1) + d_{frac})/f_o \rfloor f_o$$

where, $\theta(n-1)$ is a previous value of the third component, $d_{frac}$ is an increment value, $f_o$ is a desired output sampling frequency, and $\lfloor (\theta(n-1) + d_{frac})/f_o \rfloor$ is a floor function that returns the largest integer that is less than or equal to $(\theta(n-1) + d_{frac})/f_o$.

3. The method of claim 2, further comprising computing the increment value $d_{frac}$ according to the equation $$d_{frac} = Nf_i - \left\lfloor \frac{Nf_i}{f_o} \right\rfloor f_o,$$

where N is an up-sampling factor, $f_i$ is an input sampling frequency, and $$\left\lfloor \frac{Nf_i}{f_o} \right\rfloor$$

is a floor function that returns the largest integer that is less than or equal to $$\frac{Nf_i}{f_o}.$$

4. The method of claim 2, further comprising setting a first carryover value $\xi_{frac}(n)$ associated with the third component to one when $\theta(n-1) + d_{frac}$ is greater than or equal to $f_o$.

5. The method of claim 4, further comprising updating the second component $\beta^m(n)$ according to the equation:

$$\beta^m(n) = \left(\beta^m(n-1) + \left\lfloor \frac{Nf_i}{f_o} \right\rfloor + \xi_{frac}(n)\right) - \left\lfloor \left(\beta^m(n-1) + \left\lfloor \frac{Nf_i}{f_o} \right\rfloor + \xi_{frac}(n)\right)/N \right\rfloor N$$

where, $\beta^m(n-1)$ is the a previous value of the second component and $$\left\lfloor \beta^m(n-1) + \left\lfloor \frac{Nf_i}{f_o} \right\rfloor + \xi_{frac}(n) \right\rfloor$$

is a floor function that returns the largest integer that is less than or equal to $$\beta^m(n-1) + \left\lfloor \frac{Nf_i}{f_o} \right\rfloor + \xi_{frac}(n).$$

6. The method of claim 5, further comprising setting a second carryover value to one when the second component is greater than or equal to the up-sampling factor N.

7. The method of claim 6, further comprising incrementing the first component when the second carryover value is equal to one.

8. The method of claim 7, wherein the first component and the second component are associated with a first intermediate sample, further comprising computing a first component and a second component associated with a second intermediate sample as a function of the first component and the second component of the first intermediate sample.

9. The method of claim 8, further comprising computing the second component associated with the second intermediate sample $\beta^k(n)$ according to the equation:

$$\beta^k(n)=(\beta^m(n)+1)-\lfloor(\beta^m(n)+1)/N\rfloor N$$

where, $\lfloor(\beta^m(n)+1)+1)/N\rfloor$ is a floor function that returns the largest integer that is less than or equal to $(\beta^m(n)+1)/N$.

10. The method of claim 9, further comprising setting a third carryover value to one when the second component associated with the second intermediate sample is greater than or equal to the up-sampling factor N.

11. The method of claim 10, further comprising incrementing the first component associated with the second intermediate sample when the third carryover value is equal to one.

12. The method of claim 8, wherein the first intermediate sample comprises a previous intermediate sample and the second intermediate sample comprises a next intermediate sample.

13. The method of claim 8, wherein the first intermediate sample comprises a next intermediate sample and the second intermediate sample comprises a previous intermediate sample.

14. The method of claim 2, further comprising:

computing an interpolation coefficient using the equation $\theta(n)/f_o$; and performing interpolation to obtain the desired output sample as a function of the interpolation coefficient.

15. The method of claim 13, further comprising:

pre-calculating $1/f_o$; and setting a quality factor to be equal to d+k, where k is the largest positive number such that $2^k < f_o$ and d is the number of bits used to represent $1/f_o$ as a fixed point number.

16. An apparatus comprising, a phase tracking module that represents a relative timing between a desired output sample and a corresponding input sample of a digital signal using a first component that identifies a latest input sample of the digital signal used to generate related intermediate samples, a second component that identifies an intermediate sample, and a third component that identifies a timing difference between the desired output sample and the intermediate sample, wherein each of the components is represented as a non-approximated integer.

17. The apparatus of claim 16, wherein the phase tracking module updates the third component according to the equation:

$$\theta(n)=(\theta(n-1)+d_{frac})-\lfloor(\theta(n-1)+d_{frac})/f_o\rfloor f_o$$

where, $\theta(n-1)$ is a previous value of the third component, $d_{frac}$ is an increment value, $f_o$ is a desired output sampling frequency, and $\lfloor(\theta(n-1)+d_{frac})/f_o\rfloor$ is a floor function that returns the largest integer that is less than or equal to $(\theta(n-1)+d_{frac})/f_o$.

18. The apparatus of claim 17, wherein the phase tracking module computes the increment value $d_{frac}$ according to the equation $$d_{frac} = Nf_i - \left\lfloor \frac{Nf_i}{f_o} \right\rfloor f_o,$$

where N is an up-sampling factor, $f_i$ is an input sampling frequency, and $$\left\lfloor \frac{Nf_i}{f_o} \right\rfloor$$

is a floor function that returns the largest integer that is less than or equal to $$\frac{Nf_i}{f_o}.$$

19. The apparatus of claim 17, wherein the phase tracking module sets a first carryover value $\xi_{frac}(n)$ associated with the third component to one when $\theta(n-1)+d_{frac}$ is greater than or equal to $f_o$.

20. The apparatus of claim 19, wherein the phase tracking module updates the second component $\beta^m(n)$ according to the equation:

$$\beta^m(n) = \left(\beta^m(n-1) + \left\lfloor \frac{Nf_i}{f_o} \right\rfloor + \xi_{frac}(n)\right) - \left\lfloor \left(\beta^m(n-1) + \left\lfloor \frac{Nf_i}{f_o} \right\rfloor + \xi_{frac}(n)\right)/N \right\rfloor N$$

where, $\beta^m(n-1)$ is a previous value of the second component and $$\left\lfloor \beta^m(n-1) + \left\lfloor \frac{Nf_i}{f_o} \right\rfloor + \xi_{frac}(n) \right\rfloor$$

is a floor function that returns the largest integer that is less than or equal to $$\beta^m(n-1) + \left\lfloor \frac{Nf_i}{f_o} \right\rfloor + \xi_{frac}(n).$$

21. The apparatus of claim 20, wherein the phase tracking module sets a second carryover value to one when the second component is greater than or equal to the up-sampling factor N.

22. The apparatus of claim 21, wherein the phase tracking module increments the first component when the second carryover value is equal to one.

23. The apparatus of claim 22, wherein the first component and the second component are associated with a first intermediate sample, further comprising computing a first component and a second component associated with a second intermediate sample as a function of the first component and the second component of the first intermediate sample.

24. The apparatus of claim 23, wherein the phase tracking module computes the second component associated with the second intermediate sample $\beta^k(n)$ according to the equation:

$$\beta^k(n)=(\beta^m(n)+1)-\lfloor(\beta^m(n)+1)/N\rfloor N,$$

where $\lfloor(\beta^m(n)+1)/N\rfloor$ is a floor function that returns the largest integer that is less than or equal to $(\beta^m(n)+1)/N$.

25. The apparatus of claim 24, wherein the phase tracking module sets a third carryover value to one when the second component associated with the second intermediate sample is greater than or equal to the up-sampling factor N.

26. The apparatus of claim 25, wherein the phase tracking module increments a first component associated with the second intermediate sample when the third carryover value is equal to one.

27. The apparatus of claim 23, wherein the first intermediate sample comprises a previous intermediate sample and the second intermediate sample comprises a next intermediate sample.

28. The apparatus of claim 23, wherein the first intermediate sample comprises a next intermediate sample and the second intermediate sample comprises a previous intermediate sample.

29. The apparatus of claim 19, further comprising an interpolation module that computes an interpolation coefficient using the equation $\theta(n)/f_o$ and performs interpolation to obtain the desired output sample as a function of the interpolation coefficient.

30. The apparatus of claim 29, wherein the down-sampling module pre-calculates $1/f_o$ and sets a quality factor to be equal to $d+k$, where k is the largest positive number such that $2^k < f_o$ and d is the number of bits used to represent $1/f_o$ as a fixed point number.

31. A computer-readable medium comprising instructions that upon execution cause a processor to represent a relative timing between a desired output sample and a corresponding input sample of a digital signal using a first component that identifies a latest input sample of the digital signal used to generate related intermediate samples, a second component that identifies an intermediate sample, and a third component that identifies a timing difference between the desired output sample and the intermediate sample, wherein each of the components is represented as a non-approximated integer.

32. The computer-readable medium of claim 31, further comprising instructions that upon execution cause the processor to:
update the third component according to the equation:

$$\theta(n) = (\theta(n-1) + d_{frac}) - \lfloor (\theta(n-1) + d_{frac})/f_o \rfloor f_o$$

where, $\theta(n-1)$ is a previous value of the third component, $d_{frac}$ is an increment value, $f_o$ is a desired output sampling frequency, and $\lfloor (\theta(n-1)+d_{frac})/f_o \rfloor$ is a floor function that returns the largest integer that is less than or equal to $(\theta(n-1)+d_{frac})/f_o$; and set a first carryover value $\xi_{frac}(n)$ associated with the third component to one when $\theta(n-1)+d_{frac}$ is greater than or equal to $f_o$.

33. The computer-readable medium of claim 32, further comprising instructions that upon execution cause the processor to compute the increment value $d_{frac}$ according to the equation $$d_{frac} = Nf_i - \left\lfloor \frac{Nf_i}{f_o} \right\rfloor f_o,$$

where N is an up-sampling factor, $f_i$ is an input sampling frequency, and $$\left\lfloor \frac{Nf_i}{f_o} \right\rfloor$$

is a floor function that returns the largest integer that is less than or equal to $$\frac{Nf_i}{f_o}.$$

34. The computer-readable medium of claim 32, further comprising instructions that upon execution cause the processor to:
update the second component $\beta^m(n)$ according to the equation:

$$\beta^m(n) = \left(\beta^m(n-1) + \left\lfloor \frac{Nf_i}{f_o} \right\rfloor + \xi_{frac}(n)\right) - \left\lfloor \left(\beta^m(n-1) + \left\lfloor \frac{Nf_i}{f_o} \right\rfloor + \xi_{frac}(n)\right)/N \right\rfloor N$$

where, $\beta^m(n-1)$ is a previous value of the second component and $$\left\lfloor \beta^m(n-1) + \left\lfloor \frac{Nf_i}{f_o} \right\rfloor + \xi_{frac}(n) \right\rfloor$$

is a floor function that returns the largest integer that is less than or equal to $$\beta^m(n-1) + \left\lfloor \frac{Nf_i}{f_o} \right\rfloor + \xi_{frac}(n);$$

set a second carryover value one when the second component is greater than or equal to the up-sampling factor N; and
increment the first component when the second carryover value is equal to one.

35. The computer-readable medium of claim 34, wherein the first component and the second component are associated with a first intermediate sample, further comprising instructions that upon execution cause the processor to:
update a second component associated with a second intermediate sample $\beta^k(n)$ according to the equation:

$$\beta^k(n) = (\beta^m(n)+1) - \lfloor \beta^m(n)+1)/N \rfloor N,$$

where $\lfloor (\beta^m(n)+1)/N \rfloor$ is a floor function that returns the largest integer that is less than or equal to $(\beta^m(n)+1)/N$;
set a third carryover value to one when the second component associated with the second intermediate sample is greater than or equal to the up-sampling factor N; and
increment the first component associated with the second intermediate sample when the third carryover value associated with the second component is equal to one.

36. The computer-readable medium of claim 35, wherein the first intermediate sample comprises a previous intermediate sample and the second intermediate sample comprises a next intermediate sample.

37. The computer-readable medium of claim 35, wherein the first intermediate sample comprises a next intermediate sample and the second intermediate sample comprises a previous intermediate sample.

38. The apparatus of claim 16, wherein said apparatus is a wireless communications device.

39. An apparatus comprising, a means for representing a relative timing between a desired output sample and a corresponding input sample of a digital signal using a first component that identifies a latest input sample of the digital signal used to generate related intermediate samples, a second component that identifies an intermediate sample, and a third component that identifies a timing difference between the desired output sample and the intermediate sample, wherein each of the components is represented as a non-approximated integer.

40. The apparatus of claim 39, wherein the phase tracking module updates the third component according to the equation:

$\theta(n) = (\theta(n-1) + d_{frac}) - \lfloor(\theta(n-1) + d_{frac})/f_o\rfloor f_o$.

where, $\theta(n-1)$ is a previous value of the third component, $d_{frac}$ is an increment value, $f_o$ is a desired output sampling frequency, and $\lfloor(\theta(n-1) + d_{frac})/f_o\rfloor$ is a floor function that returns the largest integer that is less than or equal to $(\theta(n-1) + d_{frac})/f_o$.

41. The apparatus of claim 39, wherein said means for representing a relative timing comprises a phase tracking module.

42. The apparatus of claim 39, wherein said apparatus comprises a wireless communication device.

43. An apparatus comprising means for representing a relative timing between a desired output sample and a means for corresponding input sample of a digital signal using a first component that identifies a latest input sample of the digital signal used to generate related intermediate samples, a second component that identifies an intermediate sample, and a third component that identifies a timing difference between the desired output sample and the intermediate sample, wherein each of the components is represented as a non-approximated integer.

44. The apparatus of claim 43, further comprising means for updating the third component according to the equation:

$\theta(n) = (\theta(n-1) + d_{frac}) - \lfloor(\theta(n-1) + d_{frac})/f_o\rfloor f_o$.

where, $\theta(n-1)$ is a previous value of the third component, $d_{frac}$ is an increment value, $f_o$ is a desired output sampling frequency, and $\lfloor(\theta(n-1) + d_{frac})/f_o\rfloor$ is a floor function that returns the largest integer that is less than or equal to $(\theta(n-1) + d_{frac})/f_o$.

45. The apparatus of claim 44, further comprising means for computing the increment value $d_{frac}$ according to the equation $$d_{frac} = Nf_i - \left\lfloor \frac{Nf_i}{f_o} \right\rfloor f_o,$$

where $N$ is an up-sampling factor, $f_i$ is an input sampling frequency, and $$\left\lfloor \frac{Nf_i}{f_o} \right\rfloor$$

is a floor function that returns the largest integer that is less than or equal to $$\frac{Nf_i}{f_o}.$$

46. The apparatus of claim 44, further comprising means for setting a first carryover value $\xi_{frac}(n)$ associated with the third component to one when $\theta(n-1) + d_{frac}$ is greater than or equal to $f_o$.

47. The apparatus of claim 46, further comprising means for updating the second component $\beta^m(n)$ according to the equation:

$$\beta_m(n) = \left(\beta^m(n-1) + \left\lfloor \frac{Nf_i}{f_o} \right\rfloor + \xi_{frac}(n)\right) - \left\lfloor \left(\beta^m(n-1) + \left\lfloor \frac{Nf_i}{f_o} \right\rfloor + \xi_{frac}(n)\right)/N \right\rfloor N.$$

where, $\beta^m(n-1)$ is the a previous value of the second component and $$\left\lfloor \beta^m(n-1) + \left\lfloor \frac{Nf_i}{f_o} \right\rfloor + \xi_{frac}(n) \right\rfloor$$

is a floor function that returns the largest integer that is less than or equal to $$\beta^m(n-1) + \left\lfloor \frac{Nf_i}{f_o} \right\rfloor + \xi_{frac}(n).$$

48. The apparatus of claim 47, further comprising means for setting a second carryover value to one when the second component is greater than or equal to the up-sampling factor N.

49. The apparatus of claim 48, further comprising means for incrementing the first component when the second carryover value is equal to one.

50. The apparatus of claim 49, wherein the first component and the second component are associated with a first intermediate sample, further comprising means for computing a first component and a second component associated with a second intermediate sample as a function of the first component and the second component of the first intermediate sample.

51. The apparatus of claim 50, further comprising means for computing the second component associated with the second intermediate sample $\beta^k(n)$ according to the equation: $\beta^k(n) = (\beta^m(n)+1) - \lfloor(\beta^m(n)+1)/N\rfloor N$. where, $\lfloor(\beta^m(n)+1)/N\rfloor$ is a floor function that returns the largest integer that is less than or equal to $(\beta^m(n)+1)/N$.

52. The apparatus of claim 51, further comprising means for setting a third carryover value to one when the second component associated with the second intermediate sample is greater than or equal to the up-sampling factor N.

53. The apparatus of claim 52, further comprising means for incrementing the first component associated with the second intermediate sample when the third carryover value is equal to one.

54. The apparatus of claim 50, wherein the first intermediate sample comprises a previous intermediate sample and the second intermediate sample comprises a next intermediate sample.

55. The apparatus of claim 50, wherein the first intermediate sample comprises a next intermediate sample and the second intermediate sample comprises a previous intermediate sample.

56. The apparatus of claim 44, further comprising:

means for computing an interpolation coefficient using the equation $\theta(n)/f_o$; and means for performing interpolation to obtain the desired output sample as a function of the interpolation coefficient.

57. The apparatus of claim 55, further comprising:

means for pre-calculating $1/f_o$; and means for setting a quality factor to be equal to d+k, where k is the largest positive number such that $2^k < f_0$ and d is the number of bits used to represent $1/f_o$ as a fixed point number.

* * * * *